United States Patent
Sundstrom et al.

(10) Patent No.: US 9,998,152 B2
(45) Date of Patent: Jun. 12, 2018

(54) RECEIVER FRONT END ARRANGEMENT, MULTI-BAND RECEIVER AND BASE STATION

(71) Applicant: Telefonaktiebolaget LM Ericsson (publ), Stockholm (SE)

(72) Inventors: Lars Sundstrom, Sodra Sandby (SE); Daniele Mastantuono, Lund (SE); Fenghao Mu, Hjarup (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days. days.

(21) Appl. No.: 15/127,028

(22) PCT Filed: Mar. 24, 2014

(86) PCT No.: PCT/EP2014/055881
§ 371 (c)(1),
(2) Date: Sep. 18, 2016

(87) PCT Pub. No.: WO2015/144206
PCT Pub. Date: Oct. 1, 2015

(65) Prior Publication Data
US 2017/0111063 A1 Apr. 20, 2017

(51) Int. Cl.
*H04B 1/10* (2006.01)
*H04B 1/00* (2006.01)
(Continued)

(52) U.S. Cl.
CPC .............. *H04B 1/005* (2013.01); *H04B 1/10* (2013.01); *H03F 3/195* (2013.01); *H03F 3/68* (2013.01);
(Continued)

(58) Field of Classification Search
CPC ......... H03F 2200/294; H03F 2200/372; H03F 3/195; H03F 3/68; H03L 7/23
(Continued)

(56) References Cited

U.S. PATENT DOCUMENTS 9,088,340 B2 * 7/2015 Hoshihara .............. H04B 1/109
2002/0078278 A1 * 6/2002 Fazio ................... G06F 13/4072
710/104

(Continued)

FOREIGN PATENT DOCUMENTS

| EP | 1772967 A2 | 4/2007 |
| EP | 2615764 A2 | 7/2013 |

(Continued)

OTHER PUBLICATIONS

PCT International Search Report, dated May 19, 2014, in connection with International Application No. PCT/EP2014/055881, all pages.
(Continued)

*Primary Examiner* — Leila Malek
(74) *Attorney, Agent, or Firm* — Laffler Intellectual Property Law, PLLC

(57) ABSTRACT

A receiver front end arrangement comprises a radio frequency signal input suitable to be connected to an antenna arrangement, a filter bank of non-overlapping band filters associated with respective band for the multi-band reception, a signal conditioning arrangement connected to the filter bank, and a low-noise amplifier arrangement connected to the signal conditioning arrangement. The low-noise amplifier arrangement comprises a path for each band of bands of the multi-band reception. For each path associated with a band for the multi-band reception the low-noise amplifier arrangement comprises a low-noise amplifier. The respective low-noise amplifier has band pass characteristics,
(Continued)

or has a band filter connected where the band filter output has a direct connection to the input of the low-noise amplifier, corresponding to a band of the multi-band reception, respectively. The receiver front end arrangement further comprises a combiner structure arranged to combine the outputs of the respective low-noise amplifier of the paths of the low-noise amplifier arrangement. The signals at the output of the combiner structure have the same frequencies as the corresponding signals at the radio signal input. The signal conditioning arrangement is arranged to condition signals for respective path of the low-noise amplifier arrangement. A multi-band receiver comprising the receiver front end arrangement, and a base station comprising the multi-band receiver are also disclosed.

11 Claims, 4 Drawing Sheets

(51) Int. Cl.
  H03F 3/68  (2006.01)
  H03F 3/195  (2006.01)
  H03L 7/23  (2006.01)
(52) U.S. Cl.
  CPC .. H03F 2200/294 (2013.01); H03F 2200/372 (2013.01); H03L 7/23 (2013.01)
(58) Field of Classification Search
  USPC ......... 375/350; 348/726, 731, 725; 455/307, 455/296
  See application file for complete search history.

(56) References Cited

U.S. PATENT DOCUMENTS

| | | | |
|---|---|---|---|
| 2006/0009979 A1* | 1/2006 | McHale | A63F 13/10 704/270 |
| 2007/0096980 A1 | 5/2007 | Gradincic et al. | |
| 2008/0045941 A1* | 2/2008 | Fugo | A61B 18/1492 606/39 |
| 2008/0304466 A1* | 12/2008 | Gentille | H04W 72/02 370/344 |
| 2010/0190458 A1 | 7/2010 | Heng | |
| 2010/0261438 A1 | 10/2010 | Walley et al. | |
| 2010/0265875 A1 | 10/2010 | Zhao et al. | |
| 2011/0128078 A1* | 6/2011 | Doherty | H03G 3/3047 330/285 |
| 2012/0026039 A1* | 2/2012 | Ganeshan | G01S 19/33 342/357.73 |
| 2012/0327825 A1 | 12/2012 | Gudem et al. | |
| 2013/0021934 A1 | 1/2013 | Rugamer et al. | |
| 2013/0043946 A1* | 2/2013 | Hadjichristos | H04B 1/0057 330/252 |
| 2013/0154868 A1 | 6/2013 | Kehrer et al. | |
| 2013/0308952 A1* | 11/2013 | Hopkins | H04B 10/25751 398/115 |
| 2014/0009222 A1* | 1/2014 | Mitchell | G01K 7/021 330/9 |
| 2014/0370832 A1* | 12/2014 | May | H03D 7/166 455/326 |

FOREIGN PATENT DOCUMENTS

| WO | 9852292 A1 | 11/1998 |
| WO | 2007149957 A1 | 12/2007 |
| WO | WO2013/093969 | * 6/2013 |

OTHER PUBLICATIONS

PCT Written Opinion, dated May 19, 2014, in connection with International Application No. PCT/EP2014/055881, all pages.

* cited by examiner

RECEIVER FRONT END ARRANGEMENT, MULTI-BAND RECEIVER AND BASE STATION

TECHNICAL FIELD

The present invention generally relates to a receiver front end arrangement for multi-band reception of frequency bands for cellular communication, a multi-band receiver and a base station.

BACKGROUND

In cellular base stations, a front end arrangement is desired to handle more and more bands as available spectrum for cellular communication is spread to a multitude of bands. While a mobile unit is assigned to operate at a single band, or two or a few bands, at the same time, the base station, which supports connection with a multitude of mobile stations at the same time, needs to be able to handle all bands at which communication may occur at the same time. This is normally performed by having a front end device for each band as illustrated in FIG. 1, which implies that a large amount of hardware is required when the number of bands increases. This implies at least one of increased cost, increased energy consumption and increased physical size.

It is therefore a desire to provide a front end arrangement for reception in the multitude of bands, a receiver and a base station which reduces at least some of these issues when the number of bands becomes high.

SUMMARY

An object of the invention is to at least alleviate the above stated problem. The present invention is based on the understanding that a front end arrangement, which takes care of the multiple bands, where a common input signal is taken care of in the analog front end arrangement and is provided to a common mixer arrangement which provides mixing of all the bands, can reduce the amount of hardware required. The present invention is further based on the understanding that the reduction of analog radio frequency hardware can alleviate the problem of some of the increased cost, increased energy consumption and increased physical size.

According to a first aspect, there is provided a receiver front end arrangement for multi-band reception of frequency bands for cellular communication. The receiver front end arrangement comprises a radio frequency signal input suitable to be connected to an antenna arrangement, a filter bank of non-overlapping band filters associated with respective band for the multi-band reception, a signal conditioning arrangement connected to the filter bank, and a low-noise amplifier arrangement connected to the signal conditioning arrangement. The low-noise amplifier arrangement comprises a path for each band of bands of the multi-band reception. For each path associated with a band for the multi-band reception the low-noise amplifier arrangement comprises a low-noise amplifier. The respective low-noise amplifier has band pass characteristics, or has a band filter connected where the band filter output has a direct connection to the input of the low-noise amplifier, corresponding to a band of the multi-band reception, respectively. The receiver front end arrangement further comprises a combiner structure arranged to combine the outputs of the respective low-noise amplifier of the paths of the low-noise amplifier arrangement. The signals at the output of the combiner structure have the same frequencies as the corresponding signals at the radio signal input. The signal conditioning arrangement is arranged to condition signals for respective path of the low-noise amplifier arrangement.

The signal conditioning arrangement may comprise a path for each band of the bands of the multi-band reception. Each path may comprise an attenuator, and the attenuators may be controllable such that levels of signals of respective path of the low-noise amplifier arrangement are such that the signals of respective path of the low-noise amplifier arrangement are suitable to be combined by the combiner structure. The respective path of the signal conditioning arrangement may comprise an attenuator connected between corresponding path of the filter bank and an input amplifier stage of the corresponding path of the low-noise amplifier arrangement such that for each band for the multi-band reception there is formed a path through the filter bank, the signal conditioning arrangement and the low-noise amplifier arrangement. The front end arrangement may comprise a common low-noise amplifier having its input connected to each of the outputs of the band filters of the filter bank and its output connected to each input of the each attenuator of the paths of the signal conditioning arrangement. The output of each attenuator of the paths of the signal conditioning arrangement may be connected to inputs of the respective paths of the low-noise amplifier arrangement.

The signal conditioning arrangement may comprise a path for each band of the bands of the multi-band reception. Each path may comprise a variable gain amplifier, and the variable gain amplifiers may be controllable such that levels of signals of respective path of the low-noise amplifier arrangement are such that the signals of respective path of the low-noise amplifier arrangement are suitable to be combined by the combiner structure. The signal conditioning arrangement may comprise a common low-noise amplifier having its input connected to each of the outputs of the band filters of the filter bank and its output connected to each input of the each variable gain amplifier of the paths of the signal conditioning arrangement. The output of each variable gain amplifier of the paths of the signal conditioning arrangement may be connected to inputs of the respective paths of the low-noise amplifier arrangement.

The attenuators or variable gain amplifiers may be controllable such that levels of signals of respective path of the low-noise amplifier arrangement further provide a sufficient signal level without saturating elements of respective path of the low-noise amplifier arrangement.

An output of the combiner structure may be arranged to be connected to a mixer arrangement.

The respective band filters may comprise an electromechanical filter comprising any one of a surface acoustic wave filter, a bulk acoustic wave filter and a garnet filter.

The direct connection may comprise components such that the input of the low-noise amplifier is directly exposed to frequency and/or impedance characteristics of the band filter. The components may comprise one or more of a bond pad, a bond wire, a transmission line, a matching network with reactive components, an electrostatic discharge protection circuitry, a conductor on a printed circuit board, a chip carrier, a chip interposer and a chip package conductor lead.

The respective low-noise amplifier of the low-noise amplifier arrangement may comprise an integrated controllable resonator or filter which provides band pass characteristics of the respective low-noise amplifier.

The respective low-noise amplifier which has band pass characteristics, or the respective a band filter connected to the input of the low-noise amplifier, may comprise a pass-band frequency range covering one of carriers to be received within the band, a fraction of the band and the entire band.

According to a second aspect, there is provided a multi-band receiver comprising a receiver front end arrangement according to the first aspect and suitable to be connected to an antenna arrangement, a mixer arrangement connected to the receiver front end, and a baseband arrangement connected to the mixer arrangement.

According to a third aspect, there is provided a base station for operating as a radio network node in a cellular communication system, wherein the base station comprises a multi-band receiver according to the second aspect.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Figure 1:
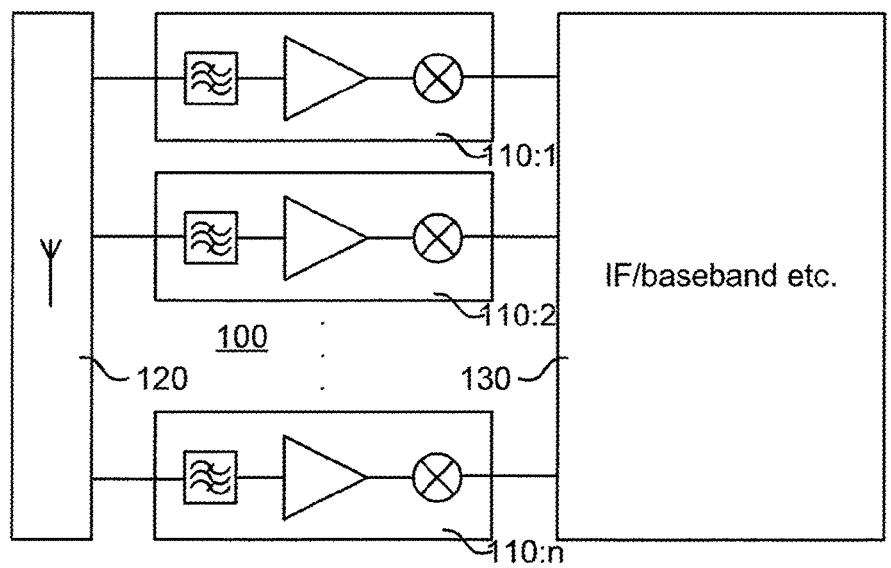
FIG. 1 illustrates an example of a conventional front end arrangement.

A conventional approach for handling multiple bands is illustrated in FIG. 1, which illustrates an arrangement 100 having a separate front 110:1, 110:2, . . . , 110:n end for each band n. The respective front ends 110:1, 110:2, . . . , 110:n may be connected to separate antennas or to one or more common antennas or antenna arrangements 120. Each band is separately filtered and amplified, and may be separately mixed and possibly digitized before being provided to intermediate frequency (IF) or baseband processing 130. Since this disclosure focuses on analog radio frequency (RF) handling between antenna and mixer, the antenna parts and IF or baseband details will not be further elucidated, and are only very schematically illustrated.

Figure 2:
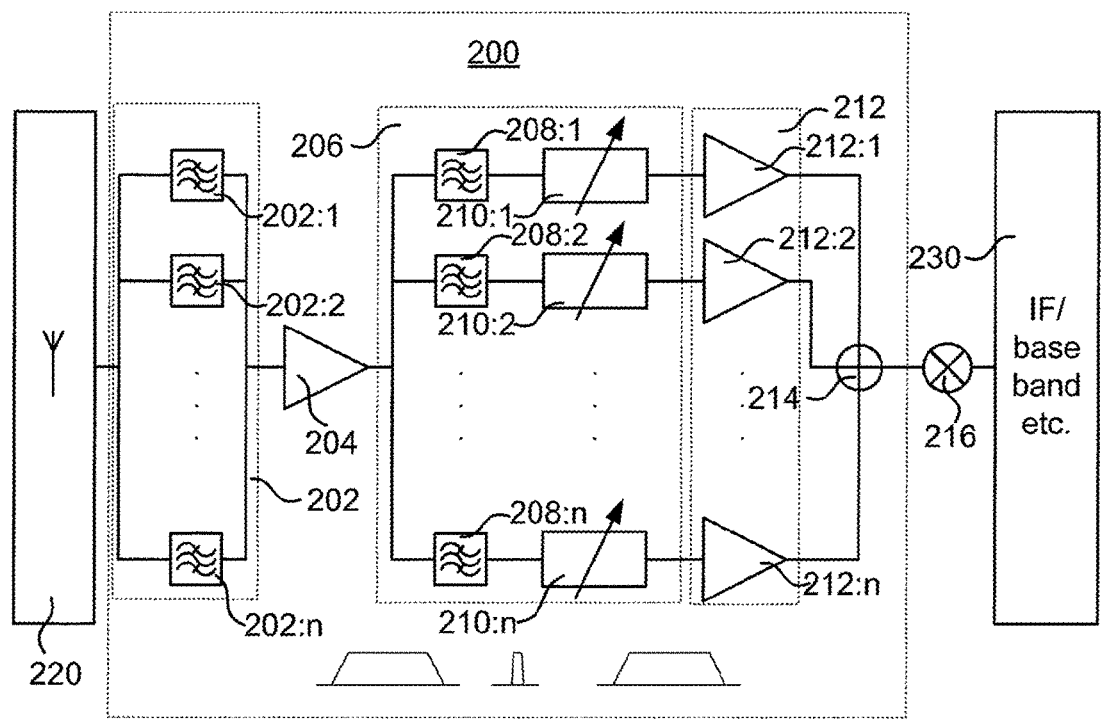
FIGS. 2 to 6 illustrate front end arrangements according to different embodiment.

FIG. 2 illustrates an embodiment of an analog front end arrangement 200 for multi-band reception of frequency bands for cellular communication which is suitable for operation between an antenna arrangement 220 and IF or baseband processing circuitry 230. Thus, there is provided the receiver front end arrangement 200 for multi-band reception of frequency bands for cellular communication. The receiver front end arrangement 200 comprises a radio frequency signal input suitable to be connected to the antenna arrangement 220, a filter bank 202 of non-overlapping band filters 202:1, 202:2, . . . , 202:n associated with respective band n for the multi-band reception, a common low-noise amplifier 204 having its input connected to the outputs of respective band filters 202:1, 202:2, . . . , 202:n of the filter bank 202, a signal conditioning arrangement 206 connected to the output of the common low-noise amplifier 204, wherein the signal conditioning arrangement 206 comprises a path for each band of the bands of the multi-band reception, wherein each path comprises a band filter 208:1, 208:2, . . . , 208:n and an attenuator 210:1, 210:2, . . . , 210:n, a low-noise amplifier arrangement 212 connected to the signal conditioning arrangement 206 comprising a path for each band of bands of the multi-band reception which is connected to the corresponding path of the signal conditioning arrangement, and for each path associated with a band for the multi-band reception the low-noise amplifier arrangement 212 comprises a low-noise amplifier 212:1, 212:2, . . . , 212:n, and a combiner structure 214 arranged to combine the outputs of the respective low-noise amplifier 212:1, 212:2, . . . , 212:n of the paths of the low-noise amplifier arrangement 212. The attenuators 210:1, 210:2, . . . , 210:n are controllable such that levels of signals of respective path of the low-noise amplifier arrangement 212 is such that the signals of respective path of the low-noise amplifier arrangement 212 is suitable to be combined by the combiner structure 214. It is to be noted that the signal is not mixed until after the combiner structure 214 by a mixer arrangement 216, i.e. the signals at the output of the combiner structure 214 has the same frequencies as the corresponding signals at the radio signal input. The signal conditioning arrangement 206 is arranged to condition signals for respective path of the low-noise amplifier arrangement, which provides for proper combining by the combiner structure 214.

The illustrations under the illustration of the front end arrangement 200 are schematic noise spectral density diagrams for the respective part of the front end arrangement 200 and will be further discussed with reference to FIGS. 3-6.

Alternatively, respective path of the signal conditioning arrangement are connected between corresponding path of the filter bank and the corresponding path of the low-noise amplifier arrangement such that for each band for the multi-band reception there is formed a path through the filter bank, the signal conditioning arrangement and the low-noise amplifier arrangement. In this case, the common low-noise amplifier 204 is omitted, and any amplification is performed by the low-noise amplifiers 212:1, 212:2, . . . , 212:n of the low-noise amplifier arrangement 212.

Additionally or alternatively, each path, e.g. of the signal conditioning arrangement, comprises a variable gain amplifier, and the variable gain amplifiers are controllable such that levels of respective path of the low-noise amplifier arrangement is suitable to be combined by the combiner structure 214. Here, the attenuators 210:1, 210:2, . . . , 210:n may be omitted.

The attenuators or variable gain amplifiers are controllable such that levels of signals of respective path of the low-noise amplifier arrangement provides a sufficient signal level without saturating elements of respective path of the low-noise amplifier arrangement.

The output of the combiner structure 214 is arranged to be connected to the mixer arrangement 230.

The respective band filters may comprise an electromechanical filter, e.g. a surface acoustic wave filter, a bulk acoustic wave filter, a garnet filter, etc.

The band filter may comprise a pass-band frequency range covering e.g. carriers to be received within the band, a fraction of the band or the entire band, whichever is found beneficiary for the bands at design of the filter structures.

Figure 3:
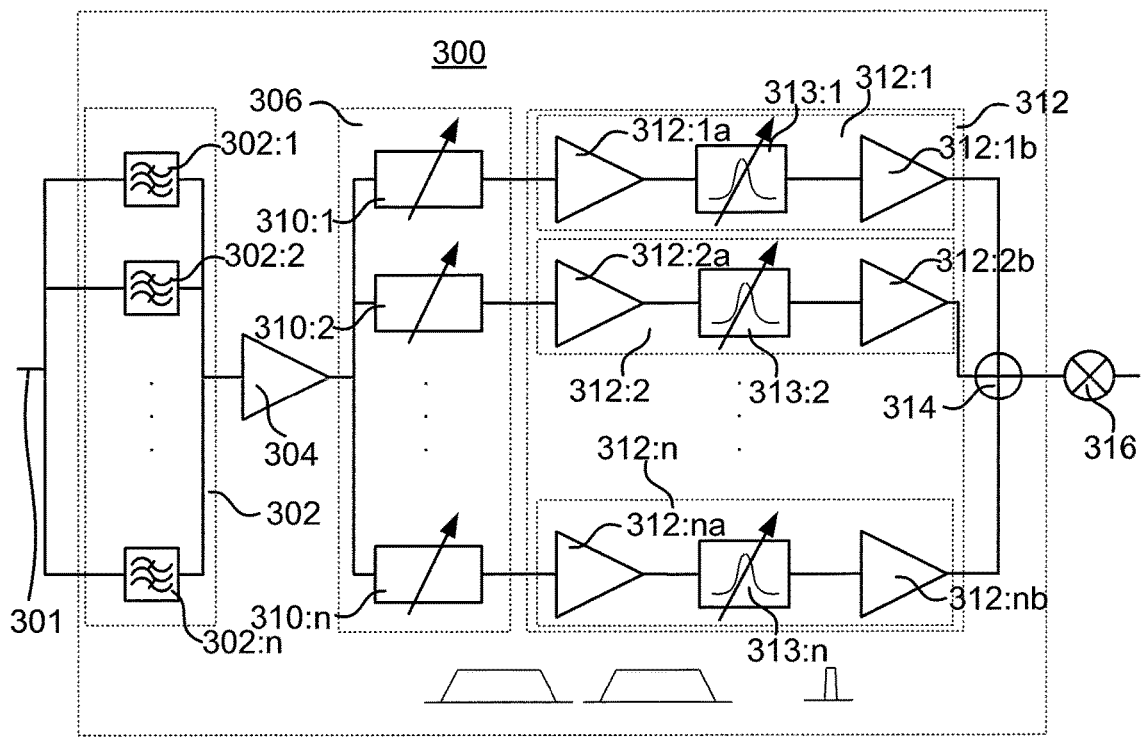

FIG. 3 illustrates an embodiment of an analog front end arrangement 300 for multi-band reception of frequency bands for cellular communication which is suitable for operation between an antenna arrangement and IF or baseband processing circuitry, which later elements are not shown in FIG. 3.

Considering the schematic noise spectral density diagrams for the respective part of the front end arrangement 200 of FIG. 2, the noise after the low-noise amplifier (LNA) 204 is likely broadband since the input signal to the LNA 204 is collected from the multitude of bands and also the active circuit of the LNA contributes with thermal noise and noise form active components of the LNA over a broad band. The band filters also filters the noise, wherein any noise at the output of the respective band filters will be suppressed outside the pass bands of the filters. When the signal is provided through the attenuators, they will introduce some broadband noise, e.g. thermal noise, which then is amplified by the low-noise amplifier arrangement 212. The solution of FIG. 3 provides, in addition to the benefits provided by the solution of FIG. 2, that noise exposed to an output stage 312:1$b$, 312:2$b$, ..., 312:$nb$ of respective LNA 312:1, 312:2, ..., 312:$n$ of the low-noise amplifier arrangement 312 will have a narrower band since the input of the output stage 312:1$b$, 312:2$b$, ..., 312:$nb$ is exposed to frequency and impedance characteristics of a resonator or filter 313:1, 313:2, ..., 313:$n$ of respective LNA 312:1, 312:2, ..., 312:$n$, wherein the amplified output accordingly will have less out-of-band noise than compared with the corresponding solution demonstrated with reference to FIG. 2.

The front end circuit of FIG. 3 comprises a filter bank 302 comprising band filters 302:1, 302:2, ..., 302:$n$ associated with respective band for the multi-band reception of n bands. The band filters are preferably non-overlapping in frequency band since the bands are reasonably distinct from each other. The outputs of the band filters 302:1, 302:2, ..., 302:$n$ are combined and amplified by an LNA 304. The output from the LNA 304 is provided to a signal conditioning arrangement 306.

Here, it can be noted that it is not necessary to have a single common LNA 304; there may be two or more LNAs, or even one LNA for each band. A reason to have more than one LNA may be that the aggregate bandwidth of all the bands is too wide for designing a single efficient LNA that can handle all the bands. If more than one LNA is used, the combining and splitting demonstrated above will be adapted accordingly, or in the case for an LNA for each band, omitted. A benefit of using a single LNA 304 is that less circuit area may be used.

The signal conditioning arrangement 306 comprises attenuators 310:1, 310:2, ..., 310:$n$. The signal input to the signal conditioning arrangement 306 is split and provided to respective band paths 1, 2, ..., n, and provided to the respective attenuator 310:1, 310:2, ..., 310:$n$.

The outputs of the signal conditioning arrangement 306 are connected to a low-noise amplifier arrangement 312. The respective attenuator 310:1, 310:2, ..., 310:$n$ of the signal conditioning arrangement 306 is connected to a respective, i.e. for each path, low-noise amplifier 312:1, 312:2, ..., 312:$n$. The respective low-noise amplifier 312:1, 312:2, ..., 312:$n$ has band pass characteristics according to the respective associated band. Thus, each LNA 312:1, 312:2, ..., 312:$n$ may have an integrated resonator or filter 313:1, 313:2, ..., 313:$n$ for providing the band pass characteristics. The resonator or filter 313:1, 313:2, ..., 313:$n$ is preferably controllable such that assignment of bands can be made for an implementation of a multi-band receiver. Each LNA 312:1, 312:2, ..., 312:$n$ may comprise a first amplifier stage 312:1$a$, 312:2$a$, ..., 312:$na$, to which the resonator or filter 313:1, 313:2, ..., 313:$n$ is a load, and a second amplifier stage 312:1$b$, 312:2$b$, ..., 312:$nb$ which provides the output of the respective LNA 312:1, 312:2, ..., 312:$n$ and also serve as a buffer and isolation stage prior combining of the band signals.

The LNA arrangement 312 is connected to a combiner structure 314 arranged to combine the outputs of the respective low-noise amplifier 312:1, 312:2, ..., 312:$n$ of the paths of the low-noise amplifier arrangement 312. The attenuators 310:1, 310:2, ..., 310:$n$ are controllable such that levels of signals of respective path of the low-noise amplifier arrangement 312 make the signals suitable to be combined by the combiner structure 314. It is to be noted that the signal is not mixed until after the combiner structure 314 by a mixer arrangement 316, i.e. the signals at the output of the combiner structure 314 has the same frequencies as the corresponding signals at the radio signal input. The signal conditioning arrangement 306 is arranged to condition signals for respective path of the low-noise amplifier arrangement, which provides for proper combining by the combiner structure 314.

Additionally or alternatively, each path, e.g. of the signal conditioning arrangement 306, comprises a variable gain amplifier, and the variable gain amplifiers are controllable such that levels of signals of respective path of the low-noise amplifier arrangement make the signals suitable to be combined by the combiner. Here, the attenuators 310:1, 310:2, ..., 310:$n$ may be omitted.

If we now consider the schematic noise spectral density diagrams for the respective part of the front end arrangement 300 of FIG. 3, the noise after LNA 304 is likely broadband for the same reasons as demonstrated with reference to FIG. 2. When the signal is provided through the attenuators 310:1, 310:2, ..., 310:$n$, they will introduce some broadband noise, e.g. thermal noise, which then is amplified by the first amplifier stage 312:1$a$, 312:2$a$, ..., 312:$na$ of the low-noise amplifier arrangement 312. The resonators or filters 313:1, 313:2, ..., 313:$n$ will apply the band pass characteristics also on the noise, wherein out-of-band noise at the input of the respective second amplifier stage 312:1$b$, 312:2$b$, ..., 312:$nb$ will be suppressed outside the pass bands of the filters, and thus out-of-band noise from respective LNA 312:1, 312:2, ..., 312:$n$ will be reduced before the combining in the combiner structure 314 such that such out-of-band noise will have limited impact on the signals for the other bands when combined. Receiver performance may thereby be improved.

Figure 4:
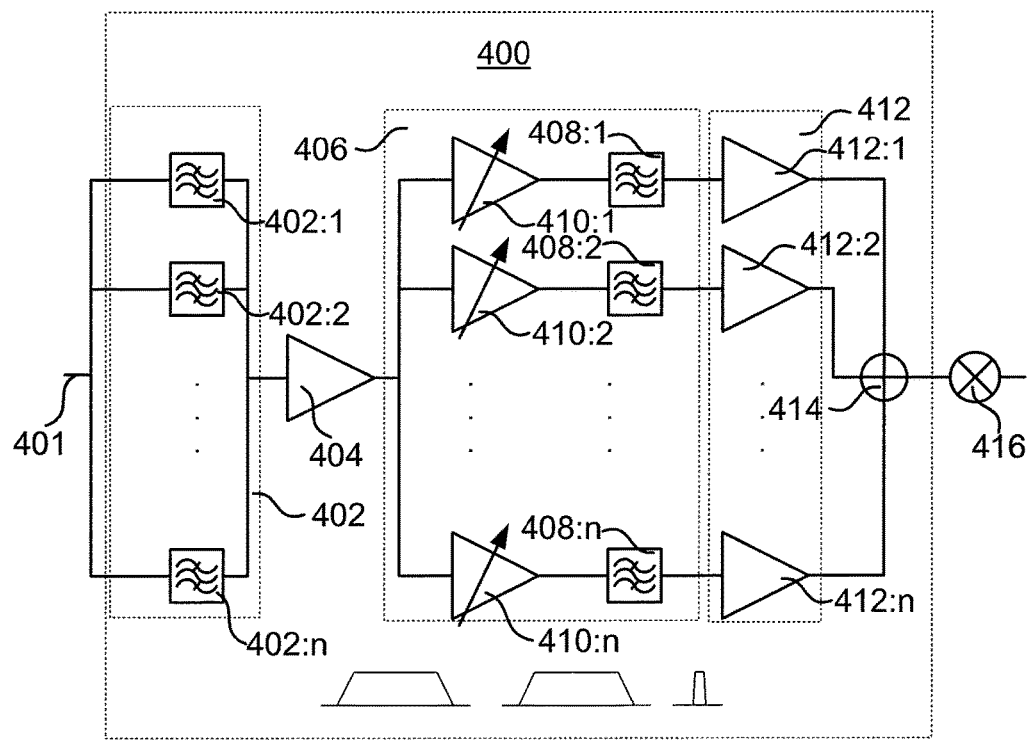

FIG. 4 illustrates an embodiment of an analog front end arrangement 400 for multi-band reception of frequency bands for cellular communication which is suitable for operation between an antenna arrangement and IF or baseband processing circuitry, which later elements are not shown in FIG. 4.

Similar to the embodiment demonstrated with reference to FIG. 3, the front end arrangement 400 comprises a filter bank 402 comprising band filters 402:1, 402:2, ..., 402:$n$ associated with respective band for the multi-band reception of n bands, and an LNA 404. The similar variations and features as demonstrated with reference to FIG. 3 are applicable also for the front end arrangement 400 of FIG. 4. The output from the LNA 404 is provided to a signal conditioning arrangement 406.

The signal conditioning arrangement 406 comprises variable gain amplifiers 410:1, 410:2, ..., 410:n and band filters 408:1, 408:2, ..., 408:n for respective band path 1, 2, ..., n. The signal input to the signal conditioning arrangement 406 is split and provided to the respective band paths 1, 2, ..., n, and provided to the respective variable gain amplifier 410:1, 410:2, ..., 410:n. The outputs of the variable gain amplifiers 410:1, 410:2, ..., 410:n are provided to the band filters 408:1, 408:2, ..., 408:n, respectively, wherein the outputs of the band filters 408:1, 408:2, ..., 408:n form the output of the signal conditioning arrangement 406. The outputs of the signal conditioning arrangement 406 are connected to a LNA arrangement 412. The respective band filter 408:1, 408:2, ..., 408:n of the signal conditioning arrangement 406 is thus connected to a respective, i.e. for each path, low-noise amplifier 412:1, 412:2, ..., 412:n. The LNA arrangement 412 is connected to a combiner structure 414 arranged to combine the outputs of the respective low-noise amplifier 412:1, 412:2, ..., 412:n of the paths of the LNA arrangement 412. The variable gain amplifiers 410:1, 410:2, ..., 410:n are controllable such that levels of signals of respective path of the LNA arrangement 412 make the signals suitable to be combined by the combiner structure 414. It is to be noted that the signal is not mixed until after the combiner structure 414 by a mixer arrangement 416, i.e. the signals at the output of the combiner structure 414 has the same frequencies as the corresponding signals at the radio signal input. The signal conditioning arrangement 406 is arranged to condition signals for respective path of the low-noise amplifier arrangement, which provides for proper combining by the combiner structure 314.

If we now consider the schematic noise spectral density diagrams for the respective part of the front end arrangement 400 of FIG. 4, the noise after LNA 404 is likely broadband for the same reasons as demonstrated with reference to FIG. 2. When the signal is provided through the variable gain amplifiers 410:1, 410:2, ..., 410:n, they will, in addition to amplifying the broadband noise at their inputs, introduce some broadband noise, e.g. thermal noise. The band filters 408:1, 408:2, ..., 408:n will filter also the noise, wherein out-of-band noise at the input of the respective LNA 412:1, 412:2, ..., 412:n will be suppressed outside the pass bands of the filters, and thus out-of-band noise from respective LNA 412:1, 412:2, ..., 412:n will be reduced before the combining in the combiner structure 414 such that such out-of-band noise will have limited impact on the signals for the other bands when combined. Receiver performance may thereby be improved.

Other combinations according to the similar approach are also feasible.

Figure 5:
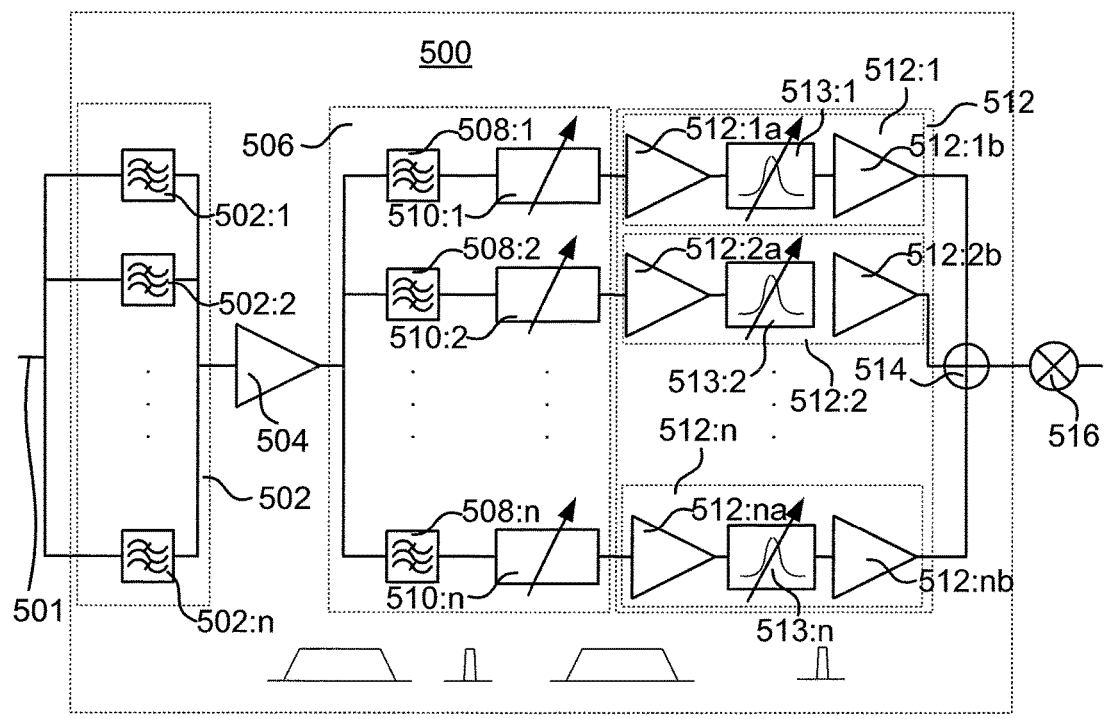

For example, FIG. 5 illustrates an embodiment of an analog front end arrangement 500 for multi-band reception of frequency bands for cellular communication where a filter bank 502, with its band filters 502:1, 502:2, ..., 502:n, and a LNA 504 is similar to what has been demonstrated with reference to FIGS. 2 to 4. A signal conditioning arrangement 506 is similar to the signal conditioning arrangement 206 of FIG. 2, but here combined with a LNA arrangement 512 similar to the LNA arrangement 312 of FIG. 3.

Thus, the signal conditioning arrangement 506 comprises a path for each band of the bands of the multi-band reception, wherein each path comprises a band filter 508:1, 508:2, ..., 508:n and an attenuator 510:1, 510:2, ..., 510:n. The outputs of the signal conditioning arrangement 506 are connected to the LNA arrangement 512. The respective attenuator 510:1, 510:2, ..., 510:n of the signal conditioning arrangement 506 is connected to a respective, i.e. for each path, low-noise amplifier 512:1, 512:2, ..., 512:n. The respective low-noise amplifier 512:1, 512:2, ..., 512:n has band pass characteristics according to the respective associated band. Thus, each LNA 512:1, 512:2, ..., 512:n may have an integrated resonator or filter 513:1, 513:2, ..., 513:n for providing the band pass characteristics. The resonator or filter 513:1, 513:2, ..., 513:n is preferably controllable such that assignment of bands can be made dynamically. Each LNA 512:1, 512:2, ..., 512:n may comprise a first amplifier stage 512:1a, 512:2a, ..., 512:na, to which the resonator or filter 513:1, 513:2, ..., 513:n is a load, and a second amplifier stage 512:1b, 512:2b, ..., 512:nb which provides the output of the respective LNA 512:1, 512:2, ..., 512:n and also serve as a buffer and isolation stage prior combining of the band signals.

The LNA arrangement 512 is connected to a combiner structure 514 arranged to combine the outputs of the respective low-noise amplifier 512:1, 512:2, ..., 512:n of the paths of the low-noise amplifier arrangement 512. The attenuators 510:1, 510:2, ..., 510:n are controllable such that levels of signals of respective path of LNA arrangement 512 make the signals suitable to be combined by a combiner structure 514. It is to be noted that the signal is not mixed until after the combiner structure 514 by a mixer arrangement 516, i.e. the signals at the output of the combiner structure 514 has the same frequencies as the corresponding signals at the radio signal input. The signal conditioning arrangement 506 is arranged to condition signals for respective path of the low-noise amplifier arrangement, which provides for proper combining by the combiner structure 514.

Additionally or alternatively, each path, e.g. of the signal conditioning arrangement 506, comprises a variable gain amplifier, and the variable gain amplifiers are controllable such that levels of signals of respective path of the low-noise amplifier arrangement make the signals suitable to be combined by the combiner. Here, the attenuators 510:1, 510:2, ..., 510:n may be omitted.

Out-of-band noise is reduced in a similar way as demonstrated for the front end arrangement 300 of FIG. 3.

Figure 6:
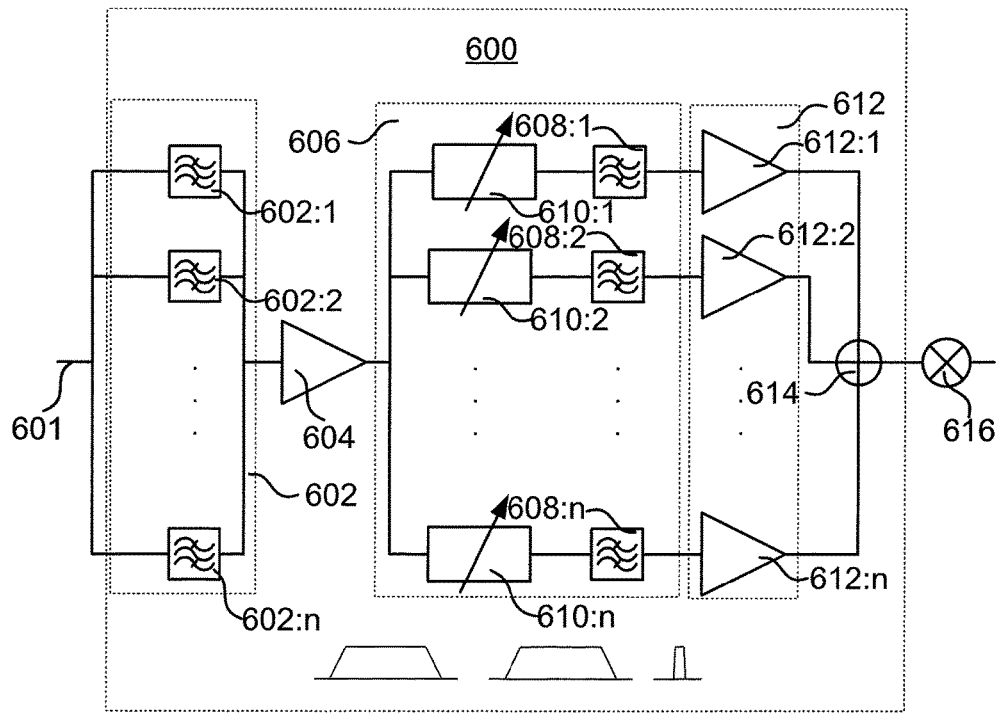

Another example is given with reference to FIG. 6. FIG. 6 illustrates an embodiment of an analog front end arrangement 600 for multi-band reception of frequency bands for cellular communication where a filter bank 602, with its band filters 602:1, 602:2, ..., 602:n, and a LNA 604 is similar to what has been demonstrated with reference to FIGS. 2 to 5.

A signal conditioning arrangement 606 comprises attenuators 610:1, 610:2, ..., 610:n and band filters 608:1, 608:2, ..., 608:n for respective band path 1, 2, ..., n. The signal input to the signal conditioning arrangement 606 is split and provided to the respective band paths 1, 2, ..., n, and provided to the respective attenuator 610:1, 610:2, ..., 610:n. The outputs of the attenuators 610:1, 610:2, ..., 610:n are provided to the band filters 608:1, 608:2, ..., 608:n, respectively, wherein the outputs of the band filters 608:1, 608:2, ..., 608:n form the output of the signal conditioning arrangement 606. The outputs of the signal conditioning arrangement 606 are connected to a LNA arrangement 612. The respective band filter 608:1, 608:2, ..., 608:n of the signal conditioning arrangement 606 is thus connected to a respective, i.e. for each path, low-noise amplifier 612:1, 612:2, ..., 612:n. The LNA arrangement 612 is connected to a combiner structure 614 arranged to combine the outputs of the respective low-noise amplifier 612:1, 612:2, ..., 612:n of the paths of the LNA arrangement 612. The attenuators 610:1, 610:2, ..., 610:n are controllable such that levels of signals of respective path of the LNA arrangement 612 make the signals suitable to be combined by the combiner structure 614. It is to be noted that the signal is not mixed until after the combiner structure 614 by a mixer arrangement 616, i.e. the signals at the output of the combiner structure 614 has the same frequencies as the corresponding signals at the radio signal input. The signal conditioning arrangement 606 is arranged to condition signals for respective path of the low-noise amplifier arrangement, which provides for proper combining by the combiner structure 614.

Out-of-band noise is reduced in a similar way as demonstrated for the front end arrangement 300 of FIG. 3.

It is to be noted that the attenuators or variable gain amplifiers as demonstrated herein may also be controllable such that levels of respective path of the LNA arrangement further provides a sufficient signal level without saturating elements of respective path of the LNA arrangement.

According to some embodiments, the circuitry of the front end arrangement is implemented on-chip except for the band filters, which may be implemented off-chip. According to some embodiments, LNAs (204, 304, 404, 504, 604 in FIGS. 2-6) and attenuators or variable gain amplifiers (310: 1-$n$, 410:1-$n$, 610:1-$n$ in FIGS. 3, 4 and 6) may be implemented on one chip using a first technology, e.g. using some high performance material such as a combination of elements from the third and fifth group of the periodic table, e.g. GaAs, GaN or InP, and LNAs (212:1-$n$, 312:1-$n$, 412: 1-$n$, 512:1-$n$, 612:1-$n$ in FIGS. 2-6), attenuators (210:1-$n$, 510:1-$n$ in FIGS. 2 and 5), mixer (216, 316, 416, 516, 616 in FIGS. 2-6) and baseband circuitry may be implemented on a second chip using a second technology which enables a higher degree of integration, e.g. together with mixed signal and digital circuitry. The second technology may for example be CMOS or SiGe BiCMOS. The band filters concerned in this disclosure may for example comprise an electromechanical filter, for example a surface acoustic wave filter, a bulk acoustic wave filter or a garnet filter. The bands handled by the respective path as of this disclosure may be considered as a band of the multi-band reception, but may also be considered as a band having a pass-band frequency range covering carriers to be received within the band, a fraction of the band, or the entire band, i.e. as of given by frequency regulating authorities.

The respective low-noise amplifier which has band pass characteristics, or which has a band filter connected, i.e. where the band filter output is directly connected to the input of the low-noise amplifier, provides for improved receiver performance, as demonstrated above with reference to some embodiments. A direct connection of band filters 408:1, 408:2, . . . , 408:$n$, 608:1, 608:2, . . . , 608:$n$ to the LNAs 412:1, 412:2, . . . , 412:$n$, 612:1, 612:2, . . . , 612:$n$ reasonably comprises some components, but may be implemented such that the input of the low-noise amplifier 412:1, 412:2, . . . , 412:$n$, 612:1, 612:2, . . . , 612:$n$ is directly exposed to frequency and/or impedance characteristics of the band filter 408:1, 408:2, . . . , 408:$n$, 608:1, 608:2, . . . , 608:$n$. Examples of such components are a bond pad, a bond wire, a transmission line, a matching network with reactive components, an electrostatic discharge protection circuitry, a conductor on a printed circuit board, a chip carrier, a chip interposer, a chip package conductor lead, etc.

Figure 7:
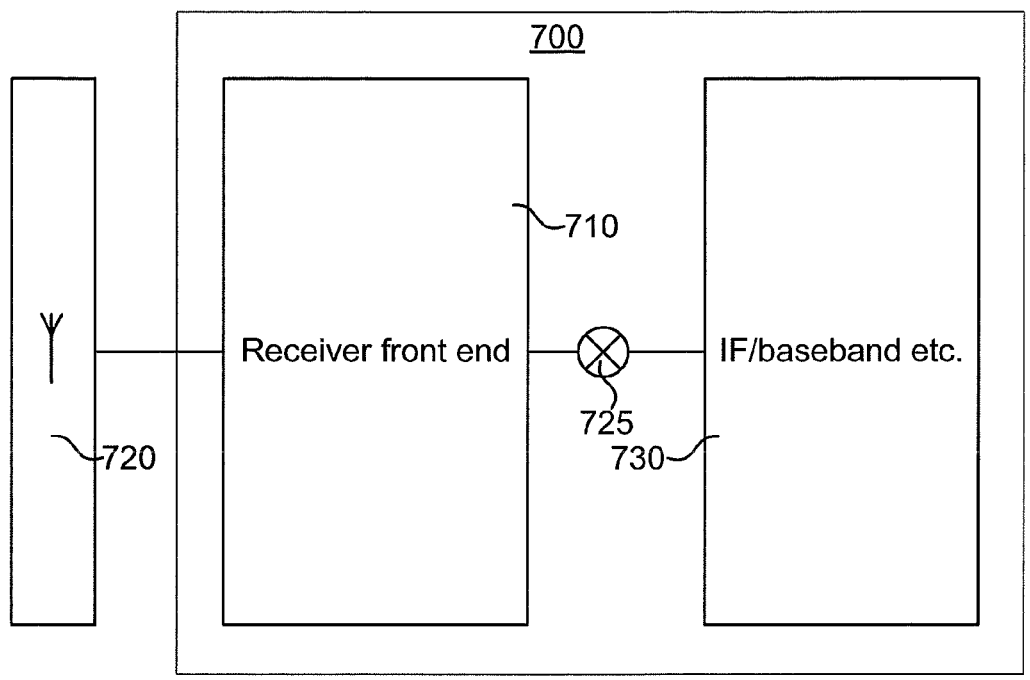
FIG. 7 illustrates a receiver according to an embodiment.

FIG. 7 schematically illustrates a multi-band receiver 700 according to embodiments. The multi-band receiver 700 comprises a receiver front end 710 according to any of the embodiments demonstrated herein. The receiver front end 710 is suitable to be connected to an antenna arrangement 720. The multi-band receiver 700 further comprises a mixer arrangement 725, connected to the receiver front end 710, and a baseband arrangement 730 connected to the mixer arrangement 725.

Figure 8:
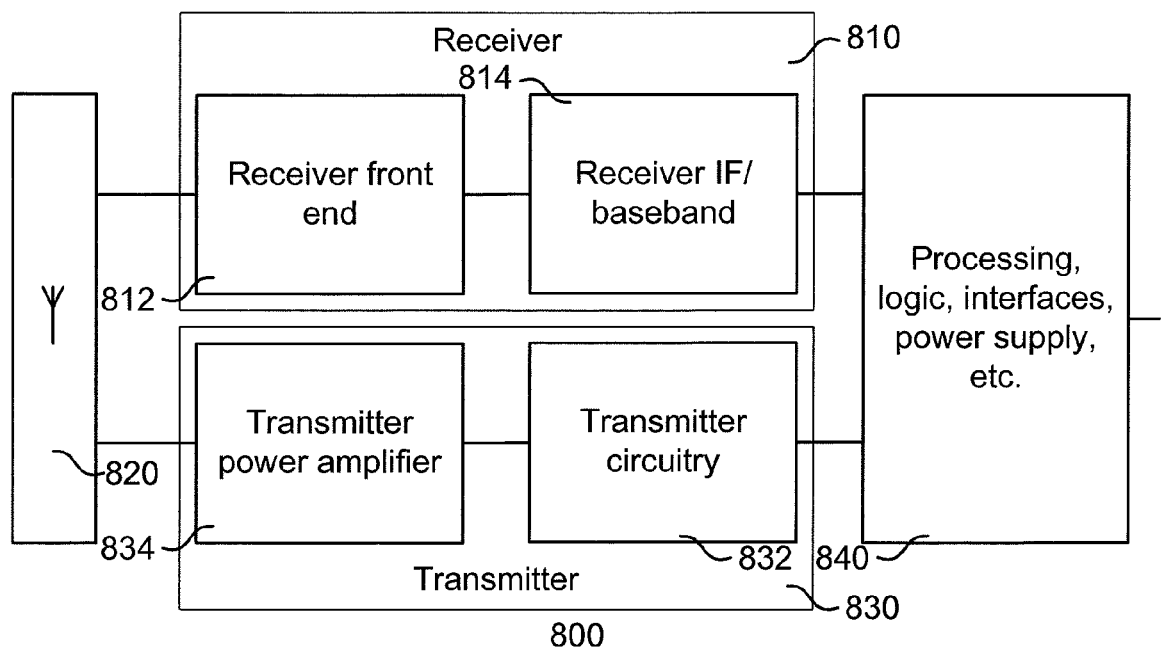
FIG. 8 illustrates a base station according to an embodiment.

FIG. 8 schematically illustrates a base station 800 for operating as a radio network node in a cellular communication system. The base station 800 comprises a multi-band receiver 810 according to embodiments demonstrated above, for example such as the multi-band receiver 700 demonstrated with reference to FIG. 7. The multi-band receiver 810 comprises a receiver front end 812 according to any of the embodiments demonstrated herein. The receiver front end 810 is suitable to be connected to an antenna arrangement 820. The multi-band receiver 810 further comprises a mixer arrangement, connected to the receiver front end 812, and a baseband arrangement 814 connected to the mixer arrangement. The base station 800 further comprises a transmitter 830. The transmitter comprises transmitter circuitry 832 suitable for modulation etc., and a transmitter power amplifier 834 which is connected to the antenna arrangement 820 for providing the signal to be transmitted. The base station 800 further comprises circuitry 840 for processing, logic, control, power supply, etc. The circuitry 840 is connected to the receiver 810 and the transmitter 830.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A receiver front end arrangement comprising:
a radio frequency signal input suitable to be connected to an antenna arrangement;
a filter bank of non-overlapping band filters associated with respective band for multi-band reception;
a signal conditioning arrangement connected to the filter bank;
a low-noise amplifier arrangement connected to the signal conditioning arrangement comprising a path for each band of bands of the multi-band reception, and for each path associated with a band for the multi-band reception the low-noise amplifier arrangement comprises a low-noise amplifier wherein the respective low-noise amplifier has band pass characteristics, or has a band filter connected where the band filter output has a direct connection to the input of the low-noise amplifier, corresponding to a band of the multi-band reception, respectively; and
a combiner structure arranged to combine the outputs of the respective low-noise amplifier of the paths of the low-noise amplifier arrangement, wherein the signals at the output of the combiner structure has the same frequencies as the corresponding signals at the radio frequency signal input,
wherein the signal conditioning arrangement is arranged to condition signals for respective path of the low-noise amplifier arrangement,
wherein the receiver front end arrangement is configured for multi-band reception of frequency bands for cellular communication,
wherein the signal conditioning arrangement comprises a path for each band of the bands of the multi-band reception, wherein each path comprises an attenuator, and the attenuators are controllable such that levels of signals of respective path of the low-noise amplifier arrangement are such that the signals of respective path of the low-noise amplifier arrangement are suitable to be combined by the combiner structure, and wherein the signal conditioning arrangement comprises a common low-noise amplifier having its input connected to each of the outputs of the band filters of the filter bank and its output connected to each input of the each attenuator of the paths of the signal conditioning arrangement, wherein the output of each attenuator of the paths of the signal conditioning arrangement is connected to inputs of the respective paths of the low-noise amplifier arrangement.

2. The receiver front end arrangement according to claim 1, wherein the attenuators or variable gain amplifiers are controllable such that levels of signals of respective path of the low-noise amplifier arrangement further provide a sufficient signal level without saturating elements of respective path of the low-noise amplifier arrangement.

3. The receiver front end arrangement according to claim 1, wherein an output of the combiner structure is arranged to be connected to a mixer arrangement.

4. The receiver front end arrangement according to claim 1, wherein the respective band filters comprises an electro-mechanical filter comprising any one of:
   a surface acoustic wave filter;
   a bulk acoustic wave filter; and
   a garnet filter.

5. The receiver front end arrangement according to claim 1, wherein the direct connection comprises components such that the input of the low-noise amplifier is directly exposed to frequency and/or impedance characteristics of the band filter.

6. The receiver front end arrangement according to claim 5, wherein the components comprises one or more of:
   a bond pad;
   a bond wire;
   a transmission line;
   a matching network with reactive components;
   an electrostatic discharge protection circuitry;
   a conductor on a printed circuit board;
   a chip carrier;
   a chip interposer; and
   a chip package conductor lead.

7. The receiver front end arrangement according to claim 1, wherein the respective low-noise amplifier of the low-noise amplifier arrangement comprises an integrated controllable resonator or filter which provides band pass characteristics of the respective low-noise amplifier.

8. The receiver front end arrangement according to claim 1, wherein the respective low-noise amplifier which has band pass characteristics, or the respective band filter connected to the input of the low-noise amplifier, comprises a pass-band frequency range covering one of:
   carriers to be received within the band;
   a fraction of the band; and
   the entire band.

9. A multi-band receiver comprising:
   a receiver front end arrangement according to claim 1 suitable to be connected to an antenna arrangement;
   a mixer arrangement connected to the receiver front end arrangement; and
   a baseband arrangement connected to the mixer arrangement.

10. A base station for operating as a radio network node in a cellular communication system, wherein the base station comprises a multi-band receiver according to claim 9.

11. A receiver front end arrangement comprising:
   a radio frequency signal input suitable to be connected to an antenna arrangement;
   a filter bank of non-overlapping band filters associated with respective band for multi-band reception;
   a signal conditioning arrangement connected to the filter bank;
   a low-noise amplifier arrangement connected to the signal conditioning arrangement comprising a path for each band of bands of the multi-band reception, and for each path associated with a band for the multi-band reception the low-noise amplifier arrangement comprises a low-noise amplifier wherein the respective low-noise amplifier has band pass characteristics, or has a band filter connected where the band filter output has a direct connection to the input of the low-noise amplifier, corresponding to a band of the multi-band reception, respectively; and
   a combiner structure arranged to combine the outputs of the respective low-noise amplifier of the paths of the low-noise amplifier arrangement, wherein the signals at the output of the combiner structure has the same frequencies as the corresponding signals at the radio frequency signal input, wherein the signal conditioning arrangement is arranged to condition signals for respective path of the low-noise amplifier arrangement, wherein the receiver front end arrangement is configured for multi-band reception of frequency bands for cellular communication, wherein the signal conditioning arrangement comprises a path for each band of the bands of the multi-band reception, wherein each path comprises a variable gain amplifier, and the variable gain amplifiers are controllable such that levels of signals of respective path of the low-noise amplifier arrangement are such that the signals of respective path of the low-noise amplifier arrangement are suitable to be combined by the combiner structure, and wherein the receiver front end arrangement comprises a common low-noise amplifier having its input connected to each of the outputs of the band filters of the filter bank and its output connected to each input of the each variable gain amplifier of the paths of the signal conditioning arrangement, wherein the output of each variable gain amplifier of the paths of the signal conditioning arrangement is connected to inputs of the respective paths of the low-noise amplifier arrangement.

* * * * *